(12) United States Patent
Dell et al.

(10) Patent No.: US 7,940,594 B2
(45) Date of Patent: May 10, 2011

(54) METHOD AND APPARATUS FOR INCREASING YIELD IN A MEMORY DEVICE

(75) Inventors: Richard Bruce Dell, Allentown, PA (US); Ross A. Kohler, Allentown, PA (US); Richard J. McPartland, Nazareth, PA (US); Hai Quang Pham, Hatfield, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 254 days.

(21) Appl. No.: 12/295,518

(22) PCT Filed: Jan. 30, 2008

(86) PCT No.: PCT/US2008/052454
§ 371 (c)(1),
(2), (4) Date: Sep. 30, 2008

(87) PCT Pub. No.: WO2009/096957
PCT Pub. Date: Aug. 6, 2009

(65) Prior Publication Data
US 2010/0238751 A1    Sep. 23, 2010

(51) Int. Cl.
*G11C 5/14* (2006.01)
(52) U.S. Cl. .......... 365/226; 365/189.09; 365/227; 365/228; 365/210.12

(58) Field of Classification Search .......... 365/226, 365/189.09, 227, 228, 210.12
See application file for complete search history.

(56) References Cited

U.S. PATENT DOCUMENTS

| 6,031,778 | A | 2/2000 | Makino et al. |
| 2003/0076729 | A1 | 4/2003 | Fetzer et al. |
| 2004/0090854 | A1 | 5/2004 | Lee et al. |
| 2006/0268647 | A1 | 11/2006 | Yamaoka et al. |
| 2008/0151675 | A1 * | 6/2008 | Torelli et al. .......... 365/227 |

FOREIGN PATENT DOCUMENTS

WO  PCT/US2008/052454   9/2008

\* cited by examiner

*Primary Examiner* — Thong Q Le
(74) *Attorney, Agent, or Firm* — Ryan, Mason & Lewis, LLP

(57) ABSTRACT

An electronic circuit includes multiple circuit elements arranged into multiple distinct subdivisions, each subdivision having a separate voltage supply connection for conveying power to the subdivision. The electronic circuit further includes a controller including multiple outputs, each of the outputs being connected to a corresponding one of the voltage supply connections. When a given one of the subdivisions does not include a weak circuit element, the controller supplies a first voltage level to the given subdivision via the corresponding voltage supply connection. When the given subdivision includes at least one weak circuit element, the controller is operative to supply at least a second voltage level to the given subdivision via the corresponding voltage supply connection, the second voltage level being greater than the first voltage level.

21 Claims, 5 Drawing Sheets

US 7,940,594 B2

METHOD AND APPARATUS FOR INCREASING YIELD IN A MEMORY DEVICE

FIELD OF THE INVENTION

The present invention relates generally to the electrical, electronic, and computer arts, and more particularly relates to semiconductor devices.

BACKGROUND OF THE INVENTION

Many applications, such as, for example, mobile communications and mobile computing, generally require integrated circuits (ICs) with low power consumption in an effort to provide enhanced battery life of devices used in these applications. Such devices may include, but are not limited to, cell phones, portable storage devices, media player devices, portable computational devices, etc. In other applications, such as, for example, data processing and network communications, it would also be desirable to employ ICs with low power consumption so as to reduce packaging, cooling and/or board costs.

By way of illustration, the power associated with voltage swing of a capacitance, C, is a significant source of overall power consumption. Power, P, associated with a capacitance will increase with a square of the voltage, V, across the capacitance (e.g., $P \propto CV^2 f$, where f is frequency). Other components of power consumption in an IC include, for example, subthreshold leakage through transistors and leakage through gate dielectric. In short channel transistors used today, subthreshold leakage increases with source-to-drain voltage. Transistor gate leakage also increases with voltage. Consequently, in order to reduce power consumption in the IC, it is desirable to reduce operating voltage in the IC.

Conventionally, the supply voltage level to a memory circuit can be increased in order to reduce the likelihood of failure in the memory circuit. In this manner, yield can be increased, but at the expense of increased power consumption in the memory circuit, which is undesirable, particularly for mobile applications. Alternatively, it is known to modify the design of memory cells and associated circuitry so that the memory circuit can operate at lower voltages. This approach, however, typically involves increasing the size of the memory cell and/or increasing complexity and component count, thereby increasing the cost of the memory device.

Accordingly, there exists a need for an improved memory circuit which does not suffer from one or more of the above-noted problems associated with conventional memory circuits.

SUMMARY OF THE INVENTION

Illustrative embodiments of the present invention meet the above-noted need by providing techniques for identifying offending memory cells in a memory circuit having a high minimum functional voltage requirement and supplying a higher voltage to those cells while still supplying lower voltage to the remaining cells in the memory circuit. The cells in the memory circuit can be organized into multiple subdivisions, or alternative groups. Assuming the number of subdivisions identified as including at least one weak memory cell therein is small compared to the total number of subdivisions, the memory circuit maintains low overall power consumption without significantly impacting yield.

In accordance with one aspect of the invention, an electronic circuit includes multiple circuit elements arranged into multiple distinct subdivisions, each subdivision having a separate voltage supply connection for conveying power to the subdivision. The electronic circuit further includes a controller including multiple outputs, each of the outputs being connected to a corresponding one of the voltage supply connections. When a given one of the subdivisions does not include a weak circuit element, the controller supplies a first voltage level to the given subdivision via the corresponding voltage supply connection. When the given subdivision includes at least one weak circuit element, the controller is operative to supply at least a second voltage level to the given subdivision via the corresponding voltage supply connection, the second voltage level being greater than the first voltage level.

The electronic circuit may include a memory circuit comprising multiple memory cells arranged into the multiple subdivisions. The electronic circuit may be implemented in an integrated circuit. In accordance with another aspect of the invention, an electronic system includes at least one integrated circuit comprising one or more electronic circuits as described above.

In accordance with yet another aspect of the invention, a method for increasing yield in an electronic circuit including a plurality of circuit elements arranged into a plurality of subdivisions, each of the subdivisions having a separate voltage supply connection corresponding thereto, includes the steps of: applying a first voltage level to at least a first subdivision which does not include any weak circuit elements; and applying at least a second voltage level to at least a second subdivision identified as including at least one weak circuit element, the second voltage level being greater than the first voltage level.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of exemplary methods and apparatus for controlling power routing in a memory circuit so as to supply a higher voltage to memory cells that are limiting functional operation of the memory circuit at a prescribed minimum functional voltage level while supplying the minimum functional voltage to remaining portions of the memory circuit. It is to be understood, however, that the techniques of the present invention are not limited to the methods and apparatus shown and described herein. Rather, embodiments of the invention are more broadly directed to techniques for advantageously improving yield in a circuit while maintaining lower power consumption in the circuit.

A "device" as the term is used herein may comprise, by way of example only and without limitation, elements such as those commonly associated with an application-specific integrated circuit (ASIC), single inline memory module (SIMM), dual inline memory module (DIMM), content-addressable memory (CAM), central processing unit (CPU), digital signal processor (DSP), or any other type of data processing or storage device, as well as portions and/or combinations of such elements having embedded memory. A "memory" as the term is used herein is intended to be broadly construed as comprising any element that can be utilized to at least temporarily store information (e.g., data), typically in binary form although not necessarily limited thereto. Although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
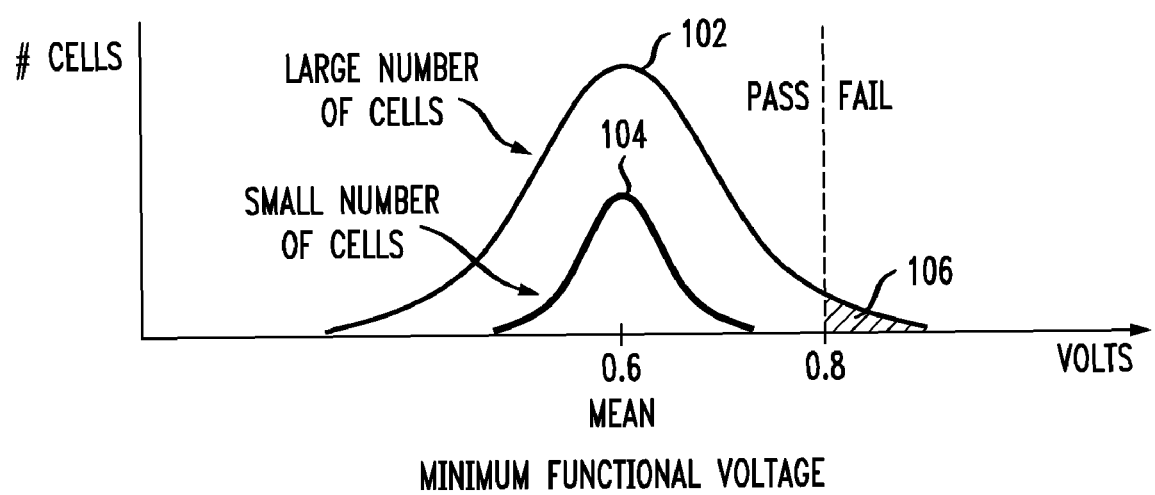
FIG. 1 depicts an illustrative comparison of minimum functional voltage for a memory circuit including a larger number of memory cells verses a memory circuit including a smaller number of memory cells.

Modern ICs often include embedded memory therein. Memory cell counts in the embedded memory can reach greater than 100 megabits (Mb). Typically, the minimum functional voltage of memory cells can be represented as a normal distribution, as depicted in FIG. 1. With reference to FIG. 1, two exemplary minimum functional voltage distributions are shown. Graph 102 represents a minimum functional voltage distribution for a memory array having a larger number of memory cells. Graph 104 represents a minimum functional voltage distribution for a memory array having a smaller number of memory cells.

As apparent from the figure, a memory array having a smaller number of cells exhibits a narrower distribution of functional minimum voltage compared to a memory array having a larger number of memory cells. This implies that larger memories have a higher minimum functional voltage requirement than smaller memories. That is, larger memories (e.g., greater than about 10 million memory cells) are statistically more likely to require a minimum functional voltage that is higher than a prescribed level. In the example shown in FIG. 1, the prescribed level is 0.8 volt; memory cells having a minimum functional voltage requirement greater than 0.8 volts are indicated by portion 106 of graph 102. Any memory array having a minimum functional voltage requirement greater than 0.8 volt in this example would result in the memory array being considered a failed device.

Figure 2:
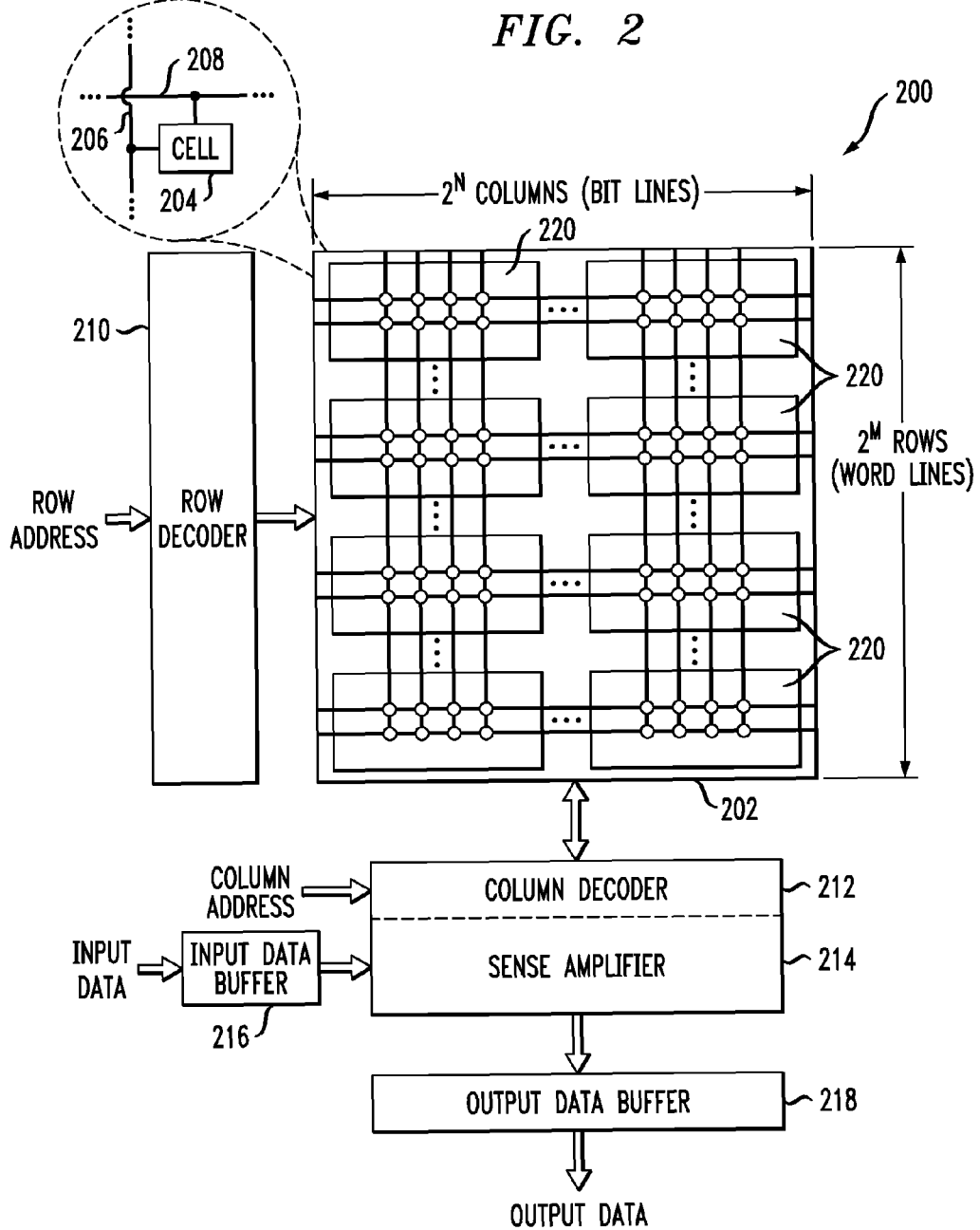
FIG. 2 is a block diagram depicting at least a portion of an exemplary memory circuit, formed in accordance with an embodiment of the present invention.

FIG. 2 is a block diagram depicting at least a portion of an exemplary memory circuit 200, formed in accordance with an embodiment of the invention. Memory circuit 200 includes a memory array 202 comprising a plurality of memory cells 204 and a plurality of bit lines 206 and word lines 208 connected to the memory cells for selectively accessing the cells. The illustrative memory circuit 200 is shown as including $2^N$ columns and $2^M$ rows, where N and M are integers. It is to be appreciated that the invention is not limited to any specific number of columns and rows. Each column preferably includes a bit line and a plurality of corresponding memory cells connected thereto. Likewise, each row preferably includes a word line and a plurality of corresponding memory cells connected thereto. Each of the memory cells 204 is associated with a unique pair of a bit line 206 and a word line 208.

Memory circuit 200 further includes a row decoder 210 coupled to the word lines for activating a selected one of the word lines as a function of a row address, or alternative control signal, and a column decoder 212 coupled to the bit lines for activating a selected one of the bit lines as a function of a column address, or alternative control signal. One or more sense amplifiers 214 are preferably provided for reading the states of the respective memory cells 204. Sense amplifiers 214 may be integrated as part of the column decoder 212 or may be included as a separate functional block. Input data to the memory circuit may be supplied to an input data buffer 216 and passed to the column decoder 212 for storage in one or more selected memory cells. Likewise, output data read from the memory cells may be supplied to an output data buffer 218 which is operative to generate an output data signal of the memory circuit 200.

Memory cells 204 in memory array 202 are preferably arranged into a plurality of subdivisions 220. The term "subdivision" as used herein may be defined so as to broadly encompass any grouping of memory cells. For example, in illustrative embodiments of the invention, subdivisions 220 may each include the same number of memory cells. Alternatively, one or more subdivisions may include a different number of memory cells relative to one or more other subdivisions in the memory circuit. Although only eight memory subdivisions are shown, the invention is not limited to any specific number of subdivisions.

Each of the memory subdivisions 220 includes a separate voltage supply connection (not explicitly shown) corresponding thereto for conveying power to the subdivision, as will be described in further detail below with reference to FIG. 3. Thus, the voltage supply routing for a given memory subdivision is separate and distinct from the voltage supply routing for the other subdivisions. It is generally beneficial to have a larger number of memory subdivisions, with possible tradeoffs including increased connection routing complexity and memory array size.

Although the subdivisions 220 are shown as comprising a plurality of columns and rows, both being smaller than in the non-subdivided memory array 202, alternative arrangements are contemplated. For example, memory array 202 may be subdivided into smaller arrays containing multiple full-length rows (e.g., rows having the same number of memory cells as rows in the non-subdivided array), smaller arrays containing multiple full-length columns (e.g., columns having the same number of memory cells as columns in the non-subdivided array), smaller groups of memory cells all arranged along one row, and/or smaller groups of memory cells all arranged along one column. Various combinations of these configurations are also contemplated.

As previously stated in conjunction with FIG. 1, as the number of memory cells in a memory array increases, the distribution of minimum functional voltage associated with the memory cells becomes wider. As shown in FIG. 1, the distribution can expand such that a small portion of cells 106 in the memory array will have a minimum functional voltage requirement that is greater than a prescribed level (e.g., 0.8 volt). For testing purposes, memory circuits having one or more memory cells with a minimum functional voltage that is greater than the prescribed level (e.g., weak memory cells) will be binned as a failure, thereby decreasing yield. A "weak" memory cell, as the term is used herein, may be defined as a memory cell having a minimum functional voltage requirement that is greater than a prescribed level.

Techniques of the present invention beneficially allow subdivisions of the memory array without any weak memory cells to operate at a lower supply voltage while allowing at least one subdivision of the memory array including one or more weak memory cells to operate at a higher supply voltage. As will typically be the case, the number of weak memory cells, and thus the number of memory subdivisions, will be small in comparison to the total number of memory subdivisions. Accordingly, the number of memory subdivisions operating at a higher voltage level will be relatively small, and thus the average power consumption in the memory circuit will not increase significantly.

Figure 3A:
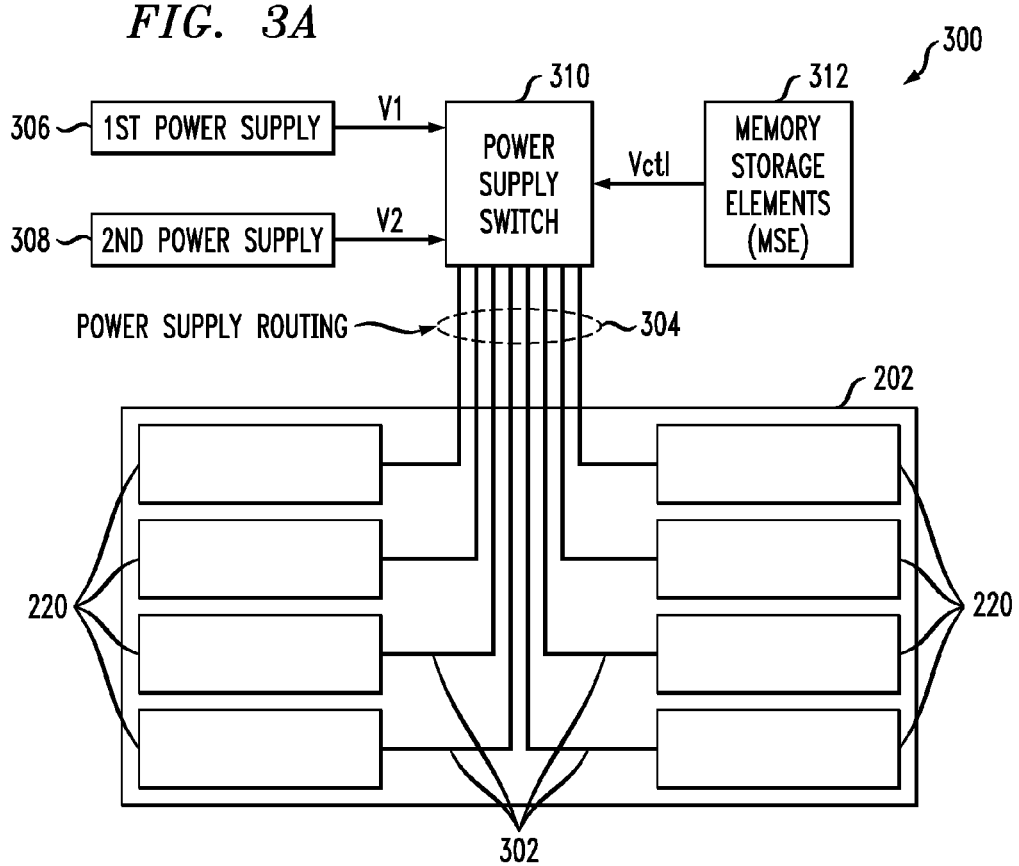
FIG. 3A is a block diagram depicting at least a portion of an exemplary power routing arrangement for supplying power to the memory array shown in FIG. 2, in accordance with an embodiment of the invention.

FIG. 3A is a block diagram depicting at least a portion of an exemplary power routing arrangement 300 for supplying power to the memory array 202 shown in FIG. 2, in accordance with an embodiment of the invention. This power routing arrangement 300 is preferably included in the memory circuit 200 of FIG. 2. As previously described, memory array 202 includes a plurality of memory cells arranged into a plurality of subdivisions 220. Each memory subdivision 220 includes a separate voltage supply connection 302 corresponding thereto for conveying power to the subdivision. Collectively, the individual voltage supply connections 302 corresponding to the memory subdivisions 220 form a power supply routing 304 to the memory array 202.

Power routing arrangement 300 includes at least first and second power supply sources, 306 and 308, respectively, and a power supply switch 310, or alternative controller, connected to the first and second power supply sources. Memory 312 (e.g., memory storage elements (MSE)) connected to the power supply switch 310 may be optionally used to store data, such as, for example, information relating to which power supply source 306, 308 is to be routed to each of the memory subdivisions 220. First power supply source 306 is operative to generate a first output voltage V1 and second power supply source 308 is operative to generate a second output voltage V2. First output voltage V1 generated by first power supply source 306 is preferably the lower prescribed minimum functional voltage that will be supplied to most memory subdivisions, those without any weak memory cells. The second output voltage V2 generated by second power supply source 308 is preferably a higher voltage than V1 that will be supplied to the few memory subdivisions identified as including at least one weak memory cell. In the event that no weak memory cells are identified in the memory array 202, all memory subdivisions will be powered by the first power supply source 306, and second power supply source 308 would be unused. Preferably, each of the power supply sources 306, 308 includes a disable circuit so that a given power supply source can be turned off when not used in order to reduce power consumption in the memory circuit, as will become apparent to those skilled in the art given the teachings herein.

Although shown as separate functional blocks, the first and second power supply sources 306 and 308, respectively, may be implemented as a single voltage supply source which includes multiple voltage outputs (e.g., taps). For example, a voltage divider (not explicitly shown) may be employed including a single voltage source and at least two voltage taps for generating voltages V1 and V2, as will be understood by those skilled in the art. Moreover, it is to be appreciated that although only two power supply sources 306 and 308 are utilized in the illustrative power routing arrangement 300 described, the invention is not limited to any specific number of power supply sources. Alternate embodiments of the invention can use more than two power supply sources to achieve finer granularity to thereby reduce power consumption in the memory circuit further than can be attained using two power supplies.

Weak memory cells, those cells having a minimum functional voltage higher than the prescribed voltage level V1 generated by first power supply source 306, are identified and located according to which memory subdivision they reside in. Those memory subdivisions identified as including weak memory cells are assigned to be powered from the second power supply source 308 generating the higher voltage V2. Preferably, voltage V2 is selected to be substantially equal to the highest minimum functional voltage requirement of the weak memory cells. If the number of weak memory cells, and therefore the number of memory subdivisions that require the second higher power supply source 308, are small in comparison to the total number of subdivisions, the average power for the memory circuit will be predominately determined in association with the lower power supply source 306 and only marginally increased by use of the second power supply source and the corresponding subdivisions containing weak memory cells. The more subdivisions that the memory array includes, the closer the average power consumption will be to that associated with the lower power supply.

Figure 3B:
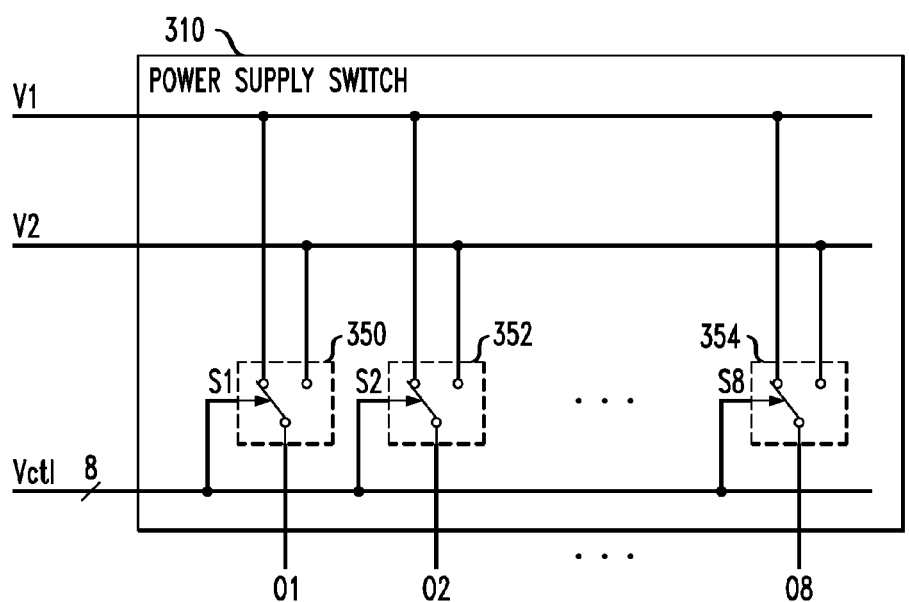
FIG. 3B is a schematic diagram depicting an exemplary power supply switch which may be used in the power routing arrangement shown in FIG. 3A, in accordance with an embodiment of the invention.

Power supply switch 310 is operative to receive, as inputs, the first and second output voltages, V1 and V2, respectively, and to route one of the first and second voltages to each of a plurality of outputs, O1 through O8, as a function of at least one control signal, Vctl supplied to the power supply switch. Each of the outputs O1 through O8 is preferably connected to a corresponding one of the memory subdivisions 220 via its individual voltage supply connection 302. Control signal Vctl may comprise a plurality of signals FIG. 3B is a schematic diagram depicting an exemplary power supply switch 310 which may be used in the power routing arrangement 300 shown in FIG. 3A, in accordance with one embodiment of the invention. Power supply switch 310 preferably includes a plurality of switch elements, 350, 353 and 354. The switch elements are depicted functionally as single-pole double-throw (SPDT) switches, although alternative implementations are contemplated. For example, at least one of the switch elements 350, 352, 354 may comprise a multiplexer, as will become apparent to those skilled in the art.

More particularly, power supply switch 310 includes a first input for receiving the first output voltage V1 generated by first power supply 306, a second input for receiving the second output voltage V2 generated by second power supply 308, and eight outputs, O1 through O8, each output connecting to a corresponding one of the memory subdivisions 220 (see FIG. 3A). First switch element 350 is operative to receive voltages V1 and V2 and to connect either V1 or V2 to corresponding output O1 as a function of a select signal, S1, applied to the first switch element. Second switch 352 is operative to receive voltages V1 and V2 and to connect either V1 or V2 to corresponding output O2 as a function of a select signal, S2, applied to the second switch element. Likewise, eighth switch 354 is operative to receive voltages V1 and V2 and to connect either V1 or V2 to corresponding output O8 as a function of a select signal, S8, applied to the eighth switch element. Collectively, select signals S1 through S8 may be represented as control signal Vctl applied to the power supply switch 310. In alternative embodiments, power supply switch 310 may include a decoder circuit for generating the plurality of select signals S1 through S8 for individually controlling each of the switch elements 350, 352, 354. Decoder circuits suitable for use with the present invention are well-known by those skilled in the art. Although power supply switch 310 is depicted as receiving only two voltages, namely, V1 and V2, the invention is not limited to any specific number of voltages. Each of the switch elements 350, 352, 354 may be modified as desired for receiving additional voltages.

Figure 4:
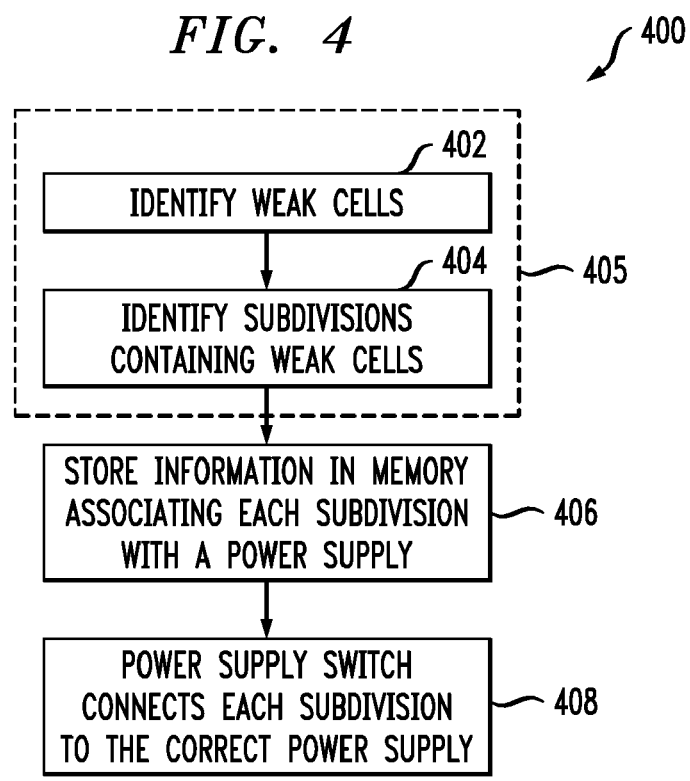
FIG. 4 is a flow diagram depicting an exemplary method for controlling power routing in a memory circuit, in accordance with an embodiment of the present invention.

FIG. 4 is a flow diagram depicting an exemplary method 400 for routing power to the individual memory subdivisions in the memory circuit, in accordance with an embodiment of the invention. Method 400 begins in step 402, wherein weak memory cells are identified. Weak memory cells may be identified, for example, during testing of the memory circuit, although alternative methodologies for identifying weak cells are contemplated. Testing of the memory circuit may be performed using external automated test equipment (ATE), as is well known in the art. Alternatively, testing can be done using built-in-self-test (BIST), as is also known in the art. Preferably, testing is operative to identify those memory cells which do not function in accordance with prescribed parameters at the voltage V1 generated by the first power supply source 306 (see FIG. 3A). Memory cells which fail the testing procedure are deemed to be weak cells.

After identifying weak memory cells in the memory array, step 404 identifies at least one memory subdivision in which the weak memory cell(s) reside. Step 404 may involve associating each weak memory cell to its corresponding memory subdivision in the memory array. A given memory subdivision may comprise more than one weak memory cell. As an output, step 404 will preferably generate a list of subdivisions containing weak memory cells. Alternatively, steps 402 and 404 may be combined into a single step 405 which is operative to directly test for weak memory subdivisions, those subdivisions containing one or more weak memory cells, without specifically identifying each weak memory cell in the array.

After determining which memory subdivisions contain weak memory cells, step 406 optionally stores information in memory (e.g., memory 312 shown in FIG. 3A) associating each subdivision with an appropriate power supply source (e.g., first power supply source 306 or second power supply source 308 in FIG. 3A). For instance, with reference again to FIG. 3A, weak subdivisions containing one or more weak memory cells are preferably associated with the second power supply source 308 supplying the higher second output voltage V2. The remaining subdivisions, those that do not contain any weak memory cells, are associated with the first power supply source 308 supplying the lower first output voltage V1. Memory 312 may comprise, for example, a structure that stores the association information. Memory suitable for use in the illustrative memory circuit may include, but is not limited to, volatile memory (e.g., static random access memory (SRAM), dynamic random access memory (DRAM), registers, etc.) or nonvolatile memory (e.g., flash memory, read-only memory (ROM), one-time-programmable (OTP) memory, few-time-programmable (FTP) memory, fuses, etc.).

With continued reference to FIG. 4, in step 408, the connection of each memory subdivision to its assigned power supply source is performed. This can be accomplished using the power supply switch 310, which is operative to read the association information stored in memory 312 and to connect each memory subdivision to one of the appropriate power supply sources 306, 308 in accordance with the association information (see FIG. 3A).

As previously explained in conjunction with FIG. 1, memory circuits with a relatively small number of memory cells (e.g., less than 1 Mb) are less likely to have weak cells—cells with minimum functional voltage distributed as far from a mean minimum functional voltage—as memory circuits having a much larger number of memory cells (e.g., greater than about 8 Mb). Thus, large memory circuits will generally be able to achieve greater yield improvement resulting from use of the teachings herein.

There may be an area penalty associated with the additional voltage supply connections and circuitry used for separately routing power to each memory subdivision. This increase in area could be a significant percentage increase for smaller memory circuits or for larger memory circuits with a large number of subdivisions. Larger memories with a relatively small number of subdivisions will have minimal percentage area increase due to the additional power routing connections and circuitry. By way of example only and without loss of generality, an 8 Mb memory with eight 0.5 Mb subdivisions could be considered a relatively large memory with a relatively small number of subdivisions. However, even 1 Mb or smaller memories could benefit from the teachings herein without a significant impact on area.

In accordance with another embodiment of the invention, a memory circuit (not shown) may comprise a plurality of independent memory macros. A memory macro may be defined as the minimum repetitive memory unit for a placement of embedded memories. The power routing to each memory macro is separate and distinct. The memory macros are selectively connected to one of a plurality of power supplies using information relating to the minimum functional voltage corresponding to each memory macro. The minimum functional voltage information may be obtained, for example, by a test procedure and stored in memory storage elements included in the memory circuit.

Although the present invention have been described herein in the context of an illustrative memory circuit, the inventive techniques may be broadly extended to increase yield while maintaining low power consumption in any electronic circuit comprising a plurality of circuit elements. This is particularly beneficial where the circuit includes a relatively large number of substantially similar circuit elements, although the circuit elements need not be the same. An example of circuit elements, other than memory cells, is sense amplifiers. A 1 Mb memory may comprise thousands of sense amplifiers, each associated with one or more columns of memory cells. Like memory cells, sense amplifiers have distributions of characteristics, such as, for example, sense amplifier offset. Typically, speed and/or minimum functional voltage is limited in a memory circuit by sense amplifier offset voltage. In order for speed to be maintained, a higher voltage (e.g., greater than a minimum functional voltage) may be supplied to one or more circuit subdivisions that contain weak or slow sense amplifiers, while a lower voltage (e.g., substantially equal to the minimum functional voltage) is supplied to remaining subdivisions in the circuit that do not include any weak or slow sense amplifiers. As with other embodiments, weak circuit elements may be identified during testing and their subdivision identity stored in memory associated with the circuit, as will be described in further detail below.

By way of example only, techniques of the invention may be applied to an electronic circuit including a plurality of identical delay blocks. The delay blocks are preferably arranged into a plurality of subdivisions, with each subdivision of delay blocks having its own separate and distinct voltage supply connection. As in the memory circuit previously described, weak delay blocks (e.g., those delay blocks requiring a minimum functional voltage that is greater than a prescribed voltage level) are preferably identified and assigned to their respective subdivisions. The voltage supplied to each subdivision containing one or more weak circuit elements is increased while the remaining subdivisions receive a supply voltage substantially equal to the minimum functional voltage for the delay blocks. In this manner, yield is improved without increasing the supply voltage to the entire IC, and thus power consumption in the IC is not significantly increased.

Figure 5:
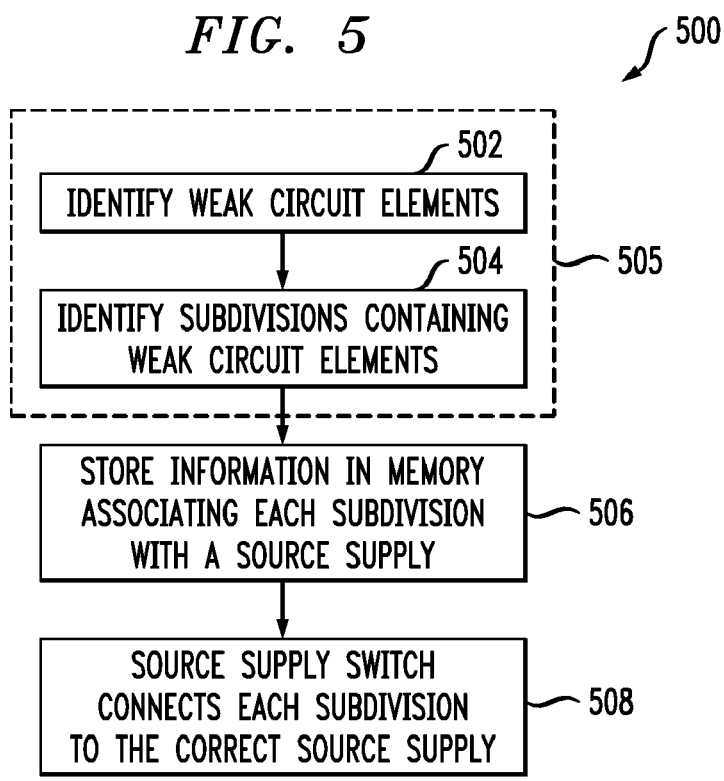
FIG. 5 is a flow diagram depicting an exemplary method for routing power to individual subdivisions of circuit elements in a circuit, in accordance with another embodiment of the invention.

FIG. 5 is a flow diagram depicting an exemplary method 500 for routing power to individual subdivisions of circuit elements in a circuit, in accordance with another aspect of the invention. Method 500 begins in step 502, wherein weak circuit elements are identified. Weak circuit elements may be identified, for example, during testing of the circuit, although alternative methodologies for identifying weak circuit elements are contemplated. Testing of the circuit may be performed using external ATE. Alternatively, testing can be done using BIST. Preferably, testing is operative to identify those circuit elements which do not function in accordance with prescribed parameters at a first voltage, V1. Circuit elements which fail the testing procedure are deemed to be weak circuit elements.

After identifying weak circuit elements in the circuit, step 504 identifies at least one subdivision in which the weak circuit elements reside. Step 504 may involve associating each weak circuit element to its corresponding subdivision in the circuit. A given subdivision may comprise more than one weak circuit element. As an output, step 504 may generate a list of subdivisions containing weak circuit elements. Alternatively, steps 502 and 504 may be combined into a single step 505 which is operative to directly test for weak subdivisions—subdivisions containing one or more weak circuit elements—without specifically identifying each weak circuit element in the circuit.

After determining which subdivisions contain weak circuit elements, step 506 optionally stores information in memory associating each subdivision with an appropriate power supply source. For instance, weak subdivisions containing one or more weak circuit elements are preferably associated with a first power supply source supplying a higher second output voltage, V2. The remaining subdivisions, those that do not contain any weak circuit elements, are associated with a first power supply source supplying the lower first output voltage V1.

In step 508, the connection of each subdivision to its assigned power supply source is performed. This can be accomplished using a power supply switch, similar to power supply switch 310 shown in FIG. 3A, which is operative to read the association information stored in memory and to connect each subdivision to one of the appropriate power supply sources in accordance with the association information.

In accordance with the teachings described herein, yield may be improved while maintaining supply voltage near a minimum functional voltage. Alternately, in other embodiments of the invention, additional parameters could be optimized, such as, for example, frequency of operation (e.g., speed), while maintaining low operating power.

Figure 6:
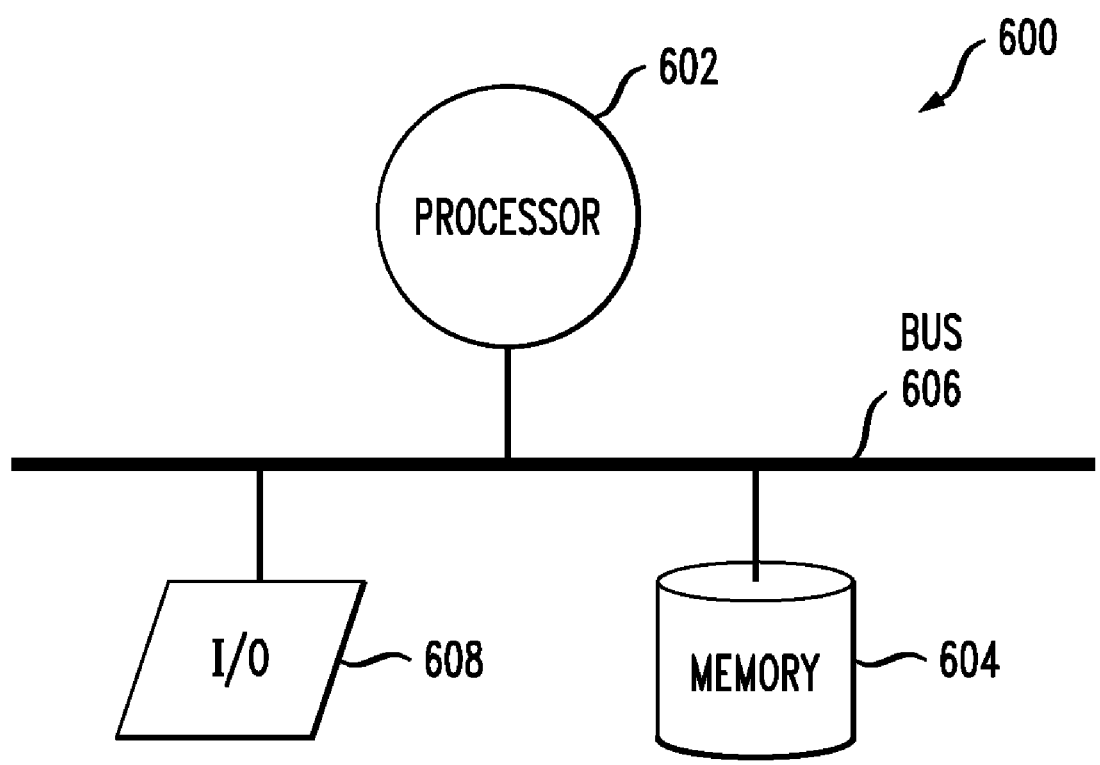
FIG. 6 is a block diagram depicting at least a portion of an exemplary electronic system in which techniques of the invention may be employed, in accordance with an embodiment of the invention.

Methodologies in accordance with embodiments of the present invention may be particularly well-suited for implementation in an electronic device or alternative system. For example, FIG. 6 is a block diagram depicting an exemplary electronic system 600 formed in accordance with an aspect of the invention. System 600 may represent, for example, ATE (e.g., IC tester, IC wafer prober, chip handler, binning equipment, etc.). System 600 may include a processor 602, memory 604 coupled to the processor (e.g., via a bus 606 or alternative connection means), as well as input/output (I/O) circuitry 608 operative to interface with the processor. The processor 602 may be configured to perform at least a portion of the methodologies of the present invention described herein above.

It is to be appreciated that the term "processor" as used herein is intended to include any processing device, such as, for example, one that includes a central processing unit (CPU) and/or other processing circuitry (e.g., network processor, DSP, microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, one or more output devices (e.g., printer, monitor, etc.) for presenting the results associated with the processor, and/or interface circuitry for operatively coupling the input or output device(s) to the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor 602. In any case, it is to be appreciated that at least a portion of the components shown in FIG. 1 may be implemented in various forms of hardware, software, or combinations thereof, e.g., one or more DSPs with associated memory, application-specific integrated circuit(s), functional circuitry, one or more operatively programmed general purpose digital computers with associated memory, etc. Given the teachings of the invention provided herein, one of ordinary skill in the art will be able to contemplate other implementations of the components of the invention.

At least a portion of the methodologies of the present invention may be implemented in otherwise conventional integrated circuit ATE for performing device verification and/or characterization. Manufacturers of conventional ATE include, but are not limited to, Teradyne Inc., Testmetrix Inc., MOSAID Technologies Inc., ALLTEQ Industries Inc., Schlumberger Ltd., Advantest Corp., and in TEST Corp.

At least a portion of the apparatus and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An electronic circuit, comprising:
a plurality of circuit elements arranged into a plurality of distinct subdivisions, each of the subdivisions having a separate voltage supply connection for conveying power to the respective subdivisions; and
a controller including a plurality of outputs, each of the outputs being connected to a corresponding one of the voltage supply connections, the controller being operative: (i) when a given one of the subdivisions does not include at least one weak circuit element, to supply a first voltage level to the given subdivision via the corresponding voltage supply connection; and (ii) when the given subdivision includes at least one weak circuit element, to supply at least a second voltage level to the given subdivision via the corresponding voltage supply connection, the second voltage level being greater than the first voltage level, wherein a given one of the circuit elements is identified as a weak circuit element if it has a higher minimum functional voltage requirement than those of the circuit elements that are not so identified.

2. The circuit of claim 1, wherein the controller is further operative to detect whether the given subdivision includes at least one weak circuit element.

3. The circuit of claim 1, further comprising a memory connected to the controller, the memory being operative to store information relating to which one of the first and at least second voltage levels is to be supplied to each of the subdivisions.

4. The circuit of claim 1, wherein the first voltage level is substantially equal to a prescribed minimum functional voltage of the electronic circuit.

5. The circuit of claim 1, wherein the second voltage level is substantially equal to a prescribed minimum functional voltage of the at least one weak circuit element.

6. The circuit of claim 1, further comprising a first voltage source operative to generate the first voltage level, and at least a second voltage source operative to generate the at least second voltage level.

7. An electronic circuit, comprising:
a plurality of circuit elements arranged into a plurality of distinct subdivisions, each of the subdivisions having a separate voltage supply connection for conveying power to the respective subdivisions; and
a controller including a plurality of outputs, each of the outputs being connected to a corresponding one of the voltage supply connections, the controller being operative: (i) when a given one of the subdivisions does not include at least one weak circuit element, to supply a first voltage level to the given subdivision via the corresponding voltage supply connection; and (ii) when the given subdivision includes at least one weak circuit element, to supply at least a second voltage level to the given subdivision via the corresponding voltage supply connection, the second voltage level being greater than the first voltage level;
wherein the controller comprises a plurality of switch elements, each of the switch elements including a first terminal for receiving the first voltage level, a second terminal for receiving the at least second voltage level, and an output connected to a corresponding one of the voltage supply connections as a function of a control signal applied to the switch element.

8. The circuit of claim 7, wherein at least one of the switch elements comprises a multiplexer.

9. An electronic circuit, comprising:
a plurality of circuit elements arranged into a plurality of distinct subdivisions, each of the subdivisions having a separate voltage supply connection for conveying power to the respective subdivisions; and
a controller including a plurality of outputs, each of the outputs being connected to a corresponding one of the voltage supply connections, the controller being operative: (i) when a given one of the subdivisions does not include at least one weak circuit element, to supply a first voltage level to the given subdivision via the corresponding voltage supply connection; and (ii) when the given subdivision includes at least one weak circuit element, to supply at least a second voltage level to the given subdivision via the corresponding voltage supply connection, the second voltage level being greater than the first voltage level;
wherein the electronic circuit comprises a memory circuit including a plurality of memory cells, each of at least a subset of the plurality of circuit elements comprising a given one of the memory cells, the controller being operative: (i) when the given subdivision does not include at least one weak memory cell, to supply the first voltage level to the given subdivision via the corresponding voltage supply connection; and (iii) when the given subdivision includes at least one weak memory cell, to supply the at least second voltage level to the given subdivision via the corresponding voltage supply connection.

10. The circuit of claim 9, wherein the controller is further operative to detect whether the given subdivision includes at least one weak memory cell.

11. The circuit of claim 9, wherein the memory circuit comprises an embedded memory array.

12. A method for increasing yield in an electronic circuit including a plurality of circuit elements arranged into a plurality of subdivisions, each of the subdivisions having a separate voltage supply connection corresponding thereto, the method comprising the steps of:
applying a first voltage level to at least a first subdivision which does not include any weak circuit elements; and
applying at least a second voltage level to at least a second subdivision identified as including at least one weak circuit element, the second voltage level being greater than the first voltage level;
wherein a given one of the circuit elements is identified as a weak circuit element if it has a higher minimum functional voltage requirement than those of the circuit elements that are not so identified.

13. The method of claim 12, further comprising identifying the at least second subdivision including at least one weak circuit element.

14. The method of claim 12, further comprising storing information associating each subdivision in the electronic circuit with one of the first and at least second voltage levels.

15. The method of claim 12, wherein the electronic circuit comprises a memory circuit including a plurality of memory cells, each of at least a subset of the plurality of circuit elements comprising a given one of the memory cells.

16. A method for increasing yield in an electronic circuit including a plurality of circuit elements arranged into a plurality of subdivisions, each of the subdivisions having a separate voltage supply connection corresponding thereto, the method comprising the steps of:
applying a first voltage level to at least a first subdivision which does not include any weak circuit elements;

applying at least a second voltage level to at least a second subdivision identified as including at least one weak circuit element, the second voltage level being greater than the first voltage level; and storing information associating each subdivision in the electronic circuit with one of the first and at least second voltage levels;

wherein the step of applying the at least second voltage level to the at least second subdivision comprises reading the stored information and applying the at least second voltage level to the at least second subdivision as a function of the stored information.

17. A method for increasing yield in an electronic circuit including a plurality of circuit elements arranged into a plurality of subdivisions, each of the subdivisions having a separate voltage supply connection corresponding thereto, the method comprising the steps of:

applying a first voltage level to at least a first subdivision which does not include any weak circuit elements; and applying at least a second voltage level to at least a second subdivision identified as including at least one weak circuit element, the second voltage level being greater than the first voltage level;

wherein the first voltage level is substantially equal to a prescribed minimum functional voltage of the electronic circuit.

18. A method for increasing yield in an electronic circuit including a plurality of circuit elements arranged into a plurality of subdivisions, each of the subdivisions having a separate voltage supply connection corresponding thereto, the method comprising the steps of:

applying a first voltage level to at least a first subdivision which does not include any weak circuit elements; and applying at least a second voltage level to at least a second subdivision identified as including at least one weak circuit element, the second voltage level being greater than the first voltage level;

wherein the second voltage level is substantially equal to a prescribed minimum functional voltage of the at least one weak circuit element.

19. An integrated circuit including at least one electronic circuit, the electronic circuit comprising:

a plurality of circuit elements arranged into a plurality of distinct subdivisions, each of the subdivisions having a separate voltage supply connection for conveying power to the respective subdivisions; and a controller including a plurality of outputs, each of the outputs being connected to a corresponding one of the voltage supply connections, the controller being operative: (i) when a given one of the subdivisions does not include at least one weak circuit element, to supply a first voltage level to the given subdivision via the corresponding voltage supply connection; and (ii) when the given subdivision includes at least one weak circuit element, to supply at least a second voltage level to the given subdivision via the corresponding voltage supply connection, the second voltage level being greater than the first voltage level, wherein a given one of the circuit elements is identified as a weak circuit element if it has a higher minimum functional voltage requirement than those of the circuit elements that are not so identified.

20. The integrated circuit of claim 19, wherein the at least one electronic circuit comprises a memory circuit including a plurality of memory cells, the memory cells being arranged into the plurality of subdivisions.

21. An electronic system, comprising:

at least one integrated circuit including at least one electronic circuit, the at least one electronic circuit comprising:

a plurality of circuit elements arranged into a plurality of distinct subdivisions, each of the subdivisions having a separate voltage supply connection for conveying power to the respective subdivisions; and a controller including a plurality of outputs, each of the outputs being connected to a corresponding one of the voltage supply connections, the controller being operative: (i) when a given one of the subdivisions does not include at least one weak circuit element, to supply a first voltage level to the given subdivision via the corresponding voltage supply connection; and (ii) when the given subdivision includes at least one weak circuit element, to supply at least a second voltage level to the given subdivision via the corresponding voltage supply connection, the second voltage level being greater than the first voltage level, wherein a given one of the circuit elements is identified as a weak circuit element if it has a higher minimum functional voltage requirement than those of the circuit elements that are not so identified.

* * * * *